United States Patent
Gilmer et al.

[11] Patent Number: 5,985,706
[45] Date of Patent: Nov. 16, 1999

[54] POLISHING METHOD FOR THIN GATES DIELECTRIC IN SEMICONDUCTOR PROCESS

[75] Inventors: Mark C. Gilmer, Austin; Mark I. Gardner, Cedar Creek, both of Tex.

[73] Assignee: Advanced Micro Devices, Inc., Sunnyvale, Calif.

[21] Appl. No.: 08/853,499

[22] Filed: May 8, 1997

[51] Int. Cl.$^6$ .................................................. H01L 21/8238
[52] U.S. Cl. ........................ 438/199; 438/588; 438/692; 438/225
[58] Field of Search ..................................... 438/759, 588, 438/225, 692, 691, 693, 199, 585, 201, 207, 218, 233, 277, 223, 227; 134/29

[56] References Cited

U.S. PATENT DOCUMENTS

| | | |
|---|---|---|
| 5,663,086 | 9/1997 | Rostoker et al. ........................ 438/210 |
| 5,866,458 | 2/1999 | Lee ......................................... 438/277 |

*Primary Examiner*—Charles Bowers
*Assistant Examiner*—Hsien-Ming Lee
*Attorney, Agent, or Firm*—Kevin L. Daffer; Conley, Rose & Tayon

[57] ABSTRACT

A semiconductor process in which an initial gate dielectric layer is formed on an upper surface of a semiconductor substrate. The initial gate dielectric layer is polished with a chemical mechanical polish to produce a finished gate dielectric layer. A thickness of the finished gate dielectric layer is less than a thickness of the initial gate dielectric layer and the thickness of the preferred finished gate dielectric layer is in the range of approximately 25 to 60 angstroms. In one embodiment, the initial gate dielectric layer is formed by thermally oxidizing the semiconductor substrate in an oxygen bearing ambient maintained at a temperature in the range of approximately 600° C. to 900° C. In an alternative embodiment, the formation of the initial gate dielectric layer is achieved by depositing an oxide. In this embodiment, the deposited oxide is preferably fabricated by a chemical vapor deposition process using a TEOS source in a CVD reactor chamber maintained at a temperature in the range of approximately 300° C. to 600° C. and a pressure of less than approximately two torrs. In a presently preferred embodiment, the polishing includes depositing a slurry on a ceramic polishing pad and applying the gate dielectric to the polishing plate in the presence of the slurry while rotating the ceramic plate with respect to the semiconductor substrate. The slurry preferably comprises fumed silica suspended in a suspending solution. The suspending solution preferably comprises KOH or $NH_3OH$. In one embodiment, the polishing plate is comprised of aluminum oxide.

19 Claims, 2 Drawing Sheets

POLISHING METHOD FOR THIN GATES DIELECTRIC IN SEMICONDUCTOR PROCESS

BACKGROUND OF THE INVENTION

1. Field of the Invention

The present invention relates to the field of semiconductor processing and more particularly to a method of fabricating ultra thin gate dielectrics using a chemical mechanical polishing technique.

2. Description of the Relevant Art

The fabrication of MOS (metal-oxide-semiconductor) transistors within a semiconductor substrate is well known. Typically, the substrate is divided into a plurality of active and isolation regions through an isolation process such as field oxidation or shallow trench isolation. A thin oxide is then grown on an upper surface of the semiconductor substrate in the active regions. This thin oxide serves as the gate oxide for subsequently formed transistors. Next, a plurality of polysilicon gate structures are formed wherein each polysilicon gate traverses an active region effectively dividing the active region into two regions referred to as the source region and the drain region. After formation of the polysilicon gates, an implant is performed to introduce an impurity distribution into the source/drain regions.

As transistor channels shrink below 0.5 micron, the limitations of conventional transistor processing become more apparent. To combat short channel effects in these smaller transistors, the depth of the source/drain junctions and the thickness of the gate oxides must be reduced. Thin oxides present significant manufacturing challenges to the manufacturer. The uniformity of the gate dielectric film across the wafer becomes more critical as the film thickness decreases. A 5 angstrom variation in film thickness across a wafer is far more significant in a 50 angstrom film than a 150 angstrom film. Greater control over oxide growth rates, uniformity, and etch rates is needed to insure that the thinner dielectric can be consistently reproduced in a manufacturing environment. Conventional gate formation techniques, which typically consist of immersing a plurality of wafers into an oxidation tube maintained at a temperature sufficient to thermally oxidize exposed silicon, do not provide sufficient film thickness control for the reliable fabrication of ultra-thin films (i.e., films with a thickness less than approximately 65 angstroms).

Despite the manufacturing difficulties noted, thin gate dielectrics are desirable not only to minimize short channel effects, but also because the transistor drive current is roughly inversely proportional to the gate oxide thickness over a wide range of operating conditions. Because higher drive currents result in faster devices, a great deal of effort has been directed towards reducing the gate oxide thickness (as well as other transistor geometries including channel length and junction depth) without significantly reducing the reliability of the integrated circuit. Therefore, it would be highly desirable to fabricate ultra-thin MOS gate dielectrics with a consistently reproducible and manufacturable process.

SUMMARY OF THE INVENTION

The problems identified above are in large part addressed by a semiconductor process in which an initial gate dielectric layer is formed on an upper surface of a semiconductor substrate. The initial gate dielectric layer is polished with a chemical mechanical polish to produce a finished gate dielectric layer. A thickness of the finished gate dielectric layer is less than a thickness of the initial gate dielectric layer and the thickness of the finished gate dielectric layer is in the range of approximately 25 to 60 angstroms. Preferably the semiconductor substrate comprises a monocrystalline silicon substrate and still more preferably includes a p-type epitaxial layer formed on a p+ silicon bulk. A preferred resistivity of the p-type epitaxial layer is in the range of approximately 10 to 15 $\Omega$-cm. A peak impurity concentration of the p+ silicon bulk is typically greater than approximately $10^{19}$ atoms/cm$^3$. In one embodiment, the initial gate dielectric layer is formed by thermally oxidizing the semiconductor substrate in an oxygen bearing ambient maintained at a temperature in the rang of approximately 600° C. to 900° C. In an alternative embodiment, the formation of the initial gate dielectric layer is achieved by depositing an oxide. In this embodiment, the deposited oxide is preferably fabricated by a chemical vapor deposition process using a TEOS source in a CVD reactor chamber maintained at a temperature in the range of approximately 300° C. to 600° C. and a pressure of less than approximately two torrs.

In a presently preferred embodiment, the polishing includes depositing a slurry on a ceramic polishing plate and applying the gate dielectric to the polishing plate in the presence of the slurry while rotating the ceramic plate with respect to the semiconductor substrate. The slurry preferably comprises fumed silica suspended in a suspending solution. The suspending solution preferably comprises KOH or NH$_3$OH. In one embodiment, the polishing plate is comprised of aluminum oxide.

The present invention further contemplates a process for fabricating a dual gate dielectric thickness integrated circuit. The process includes forming a gate dielectric layer having an initial thickness on an upper surface of a semiconductor substrate. The thickness of a first portion of the gate dielectric layer is then increased to a first thickness. The first portion of the gate dielectric layer is aligned over a first region of the semiconductor substrate. Thereafter, the gate dielectric layer is polished with a chemical mechanical polish to reduce the thickness of the first portion of the gate dielectric layer to a final thickness that is less than the first thickness and greater than the initial thickness such that the gate dielectric layer includes a first portion which has a final thickness and a second portion which has an initial thickness. The second portion of the gate dielectric layer is aligned over a second region of the semiconductor substrate. The second region is laterally displaced from the semiconductor substrate first region. First and second conductive gate structures are then formed over the first and second portions respectively of the gate dielectric layer. The conductive gate structures are further aligned over respective channel regions within the first and second regions of the semiconductor substrate. A first and a second pair of source/drain structures are then formed within first and second pairs of source/drain regions of the semiconductor substrate. The pairs of source/drain regions are laterally displaced on either side of respective channel regions of the semiconductor substrate.

The preferred semiconductor substrate includes a p-type epitaxial layer formed on an upper surface of a p+ silicon bulk. A resistivity of the p-type epitaxial layer is preferably in the range of approximately 10 to 15 $\Omega$-cm. The preferred formation of the gate dielectric layer is accomplished by immersing the semiconductor substrate in an oxygen bearing ambient maintained at a temperature in the range of approximately 700° C. to 900° C. to thermally oxidize an upper surface of the semiconductor substrate. The preferred method of increasing the thickness of the first portion of the gate dielectric layer is accomplished by selectively oxidizing the first portion of the gate dielectric layer. The selective oxidation of the first portion of the gate dielectric layer is preferably accomplished by forming an oxidation inhibiting mask over the second portion of the gate dielectric layer and immersing the semiconductor substrate into an oxygen bearing ambient maintained at a temperature in the range of approximately 700° C. to 900° C. In a presently preferred embodiment, the oxidation inhibiting mask is a silicon nitride mask. The polishing is accomplished by depositing a slurry on a ceramic polishing plate and applying the gate dielectric to the polishing gate in the presence of the slurry while rotating the polishing plate with respect to the semiconductor substrate. The preferred slurry comprises fumed silica suspended in a suspending solution. The preferred suspending solution is KOH or $NH_3OH$. The preferred polishing plate is comprised of aluminum oxide.

BRIEF DESCRIPTION OF THE DRAWINGS

Other objects and advantages of the invention will become apparent upon reading the following detailed description and upon reference to the accompanying drawings in which.

Figure 1:
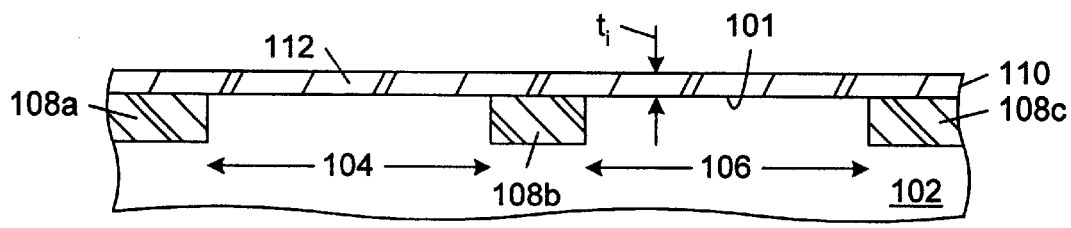
FIG. 1 is a partial cross-sectional view of a semiconductor substrate upon which an initial gate dielectric layer has been formed.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents, and alternatives falling within the spirit and scope of the present invention as defined by the appended claims.

DETAILED DESCRIPTION OF THE DRAWINGS

Turning now to the drawings, FIGS. 1 through 7 show a presently preferred processing sequence for producing an ultra thin (i.e., less than approximately 60 angstroms in thickness) gate dielectric and for producing a dual gate dielectric thickness integrated circuit using a chemical mechanical polish to achieve a final desired gate dielectric thickness. In FIG. 1, semiconductor substrate 102 is provided. Preferably, semiconductor substrate 102 comprises a single crystal silicon substrate. In a presently preferred embodiment useful in the manufacture of CMOS integrated circuits, semiconductor substrate 102 typically includes a p-type epitaxial layer formed above a p+ silicon bulk. A resitivity of the p-type epitaxial layer is preferably in the range of approximately 10 to 15 Ω-cm. The p+ silicon bulk typically includes a p-type impurity distribution such as boron wherein the peak impurity concentration in the p+ silicon bulk region is in excess of $10^{19}$ atoms/cm$^3$.

Semiconductor substrate 102, as shown in FIG. 1, includes a first region 104 and a second region 106 that is laterally displaced from first region 104. Isolation structures 108a, 108b, and 108c (collectively referred to as isolation regions 108) have been fabricated into semiconductor substrate 102. Isolation structures such as isolation structures 108 are well known within the field of semiconductor processing. As their name implies, isolation structures provide physical and electrical isolation between neighboring regions of the semiconductor substrate so that a plurality of electrically isolated transistors may be fabricated into the single semiconductor substrate 102. The isolation structures 108 shown in FIG. 1 are of the shallow trench isolation variety. It will be appreciated to those skilled in the art that alternative isolation structures such as LOCOS isolation structures may be substituted for the shallow trench isolation structures of isolation structures 108.

An initial gate dielectric layer 110 is formed on an upper surface 101 of semiconductor substrate 102. Initial gate dielectric layer 110 has an initial thickness $t_i$. In the preferred embodiment, initial gate dielectric layer is fabricated with a thermal oxidation process during which semiconductor substrate 102 is immersed in an oxygen bearing ambient maintained at a temperature in the range of approximately 700° C. to 900° C. Thermal oxidation can be accomplished in a conventional multi-wafer tube-type oxidation furnace or, alternatively, in a single wafer, rapid thermal apparatus. As an alternative to the thermal formation of initial gate dielectric layer 110, a chemical vapor deposition process may be substituted in an appropriate application. In such an embodiment, an oxide film is typically deposited upon upper surface 101 of semiconductor substrate 102 by placing semiconductor substrate 102 in a chemical deposition reactor chamber maintained at a temperature in the range of approximately 300° C. to 600° C. and introducing an oxidation source such as TEOS into the reactor chamber. For semiconductor processes which include gate dielectric layers having thicknesses less than approximately 60 angstroms, thermal formation of the gate dielectric film typically results in film thickness variations which may be greater than acceptable limits. The present invention proposes to minimize or eliminate the variability introduced by the thermal formation of ultra thin gate dielectric films through the use of a subsequent high precision polishing process.

Figure 2:
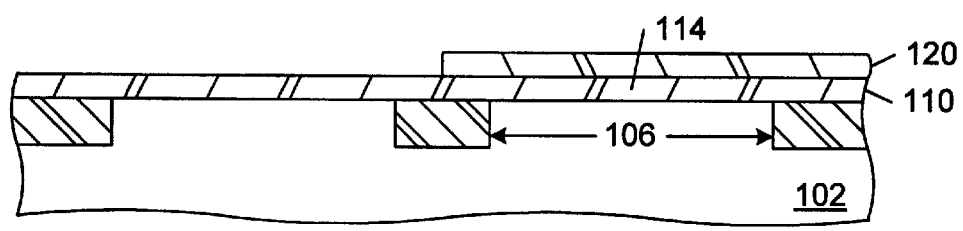
FIG. 2 is a processing step subsequent to FIG. 1 in which an oxidation inhibiting mask has been formed over a second portion of the gate dielectric layer.

Turning now to FIG. 2, a processing step unique to the embodiment of the present invention which contemplates the formation of a dual gate dielectric thickness integrated circuit is shown. In this embodiment, an oxidation inhibiting mask is formed over a second portion 114 of initial gate dielectric layer 110. First portion 112 of initial gate dielectric layer 110 is laterally aligned over second region 106 of semiconductor substrate 102. Oxidation inhibiting mask 120 is patterned over second portion 114 of initial gate dielectric layer 110, in a preferred embodiment, using a thin film deposition process followed by conventional photolithography mask and etch techniques. Oxidation inhibiting mask 120 suitably comprises CVD silicon nitride suitably deposited by thermally decomposing silane and ammonium ($NH_3$) in a CVD reactor chamber.

Figure 3:
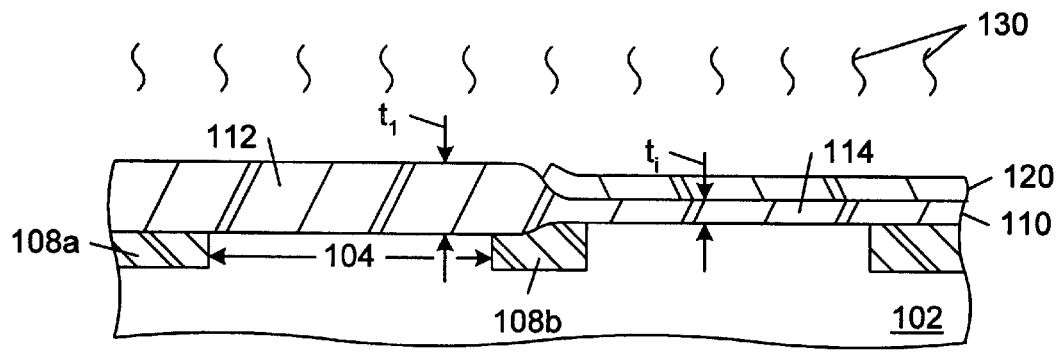
FIG. 3 is a processing step subsequent to FIG. 2 in which a thickness of a first portion of the gate dielectric layer has been increased with a thermal oxidation process.

Turning to FIG. 3, a processing step subsequent to FIG. 2 is shown in which a thickness of first portion 112 of initial gate dielectric layer 110 is increased from an initial thickness $t_i$ to a first thickness $t_f$. In the embodiment shown in FIG. 3, the thickness of first portion 112 of initial gate dielectric layer 110 is increased by selectively thermally oxidizing first portion 112 in the presence of oxidation inhibiting mask 120. As will be appreciated to those skilled in the art of semiconductor processing, the thermal oxidation of a dielectric film such as a thermal or CVD oxide in the presence of a patterned oxidation inhibiting mask such as silicon nitride results in the selective thickening of portions of the dielectric film that are not covered by the oxidation inhibiting mask. The thermal oxidation process preferably used to thicken first portion 112 of initial gate dielectric layer 110 is represented in FIG. 3 as reference numeral 130. Thermal oxidation process 130 typically comprises an oxygen bearing ambient maintained at a temperature in the range of approximately 700° C. to 900° C. as described previously with respect to the thermal formation of initial gate dielectric layer 110. Subsequent to thermal oxidation process 130, it will be appreciated that initial gate dielectric film 110 includes a first portion 112 which has a first thickness $t_f$ and a second portion 114 which has an initial thickness $t_i$ that is less than the first thickness $t_f$. First portion 112 of initial gate dielectric layer 110 is laterally aligned over first region 104 of semiconductor substrate 102.

Figure 4:
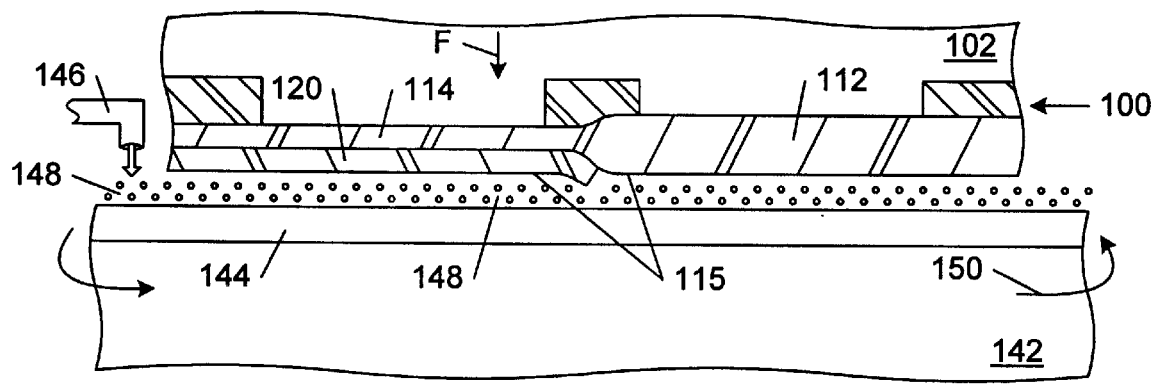
FIG. 4 is a processing step subsequent to FIG. 3 in which a chemical mechanical polish performed on the first portion of the gate dielectric layer.

Turning now to FIG. 4, a chemical mechanical polish is performed to reduce a thickness of first portion 112 of initial gate dielectric layer 110. The chemical mechanical polish apparatus 140 used to perform the chemical mechanical polish of initial gate dielectric layer 110 includes a polish platen 142 upon which a polishing pad 144 is affixed. A chemical mechanical polish slurry 148 is deposited upon polishing pad 144 through a slurry delivery mechanism 146. The semiconductor wafer 100 which includes semiconductor substrate 102 and initial gate dielectric layer 110 is brought into contact with polishing pad 144 in the presence of the slurry 148 by applying a force F to semiconductor wafer 100 as shown in FIG. 4. The chemical mechanical polish apparatus 140 is then rotated with respect to semiconductor 100 to effect a polish of initial gate dielectric film 110. The rigidity of polishing pad 140 in a conventional chemical mechanical polish is typically insufficient to prevent significant conformation of polishing plate 142 to a topography 115 defined by the upper surface of semiconductor wafer 100. To achieve high precision polishing necessary to fabricate ultra thin gate dielectrics, the present invention contemplates a ceramic polishing pad 144 which has a rigidity sufficient to prevent any deformation or conformation of polishing pad 144 to topography 115 upon application of force F to semiconductor substrate 100. In the presently preferred embodiment, an ideal polishing pad comprises aluminum oxide which, in addition to possessing the necessary rigidity, also provides a source of abrasive material to replenish the abrasive component of slurry 148. In one embodiment, the ceramic polishing pad 144 is further covered by a 100,000 mesh diamond screen. Preferably, slurry 148 comprises fumed silica in a suspending solution. The suspending solution preferably comprises potassium hydroxide (KOH) or ammonium hydroxide ($NH_3OH$). Alternatively, the abrasive material may comprise cerium oxide or alumina oxide.

Figure 5:
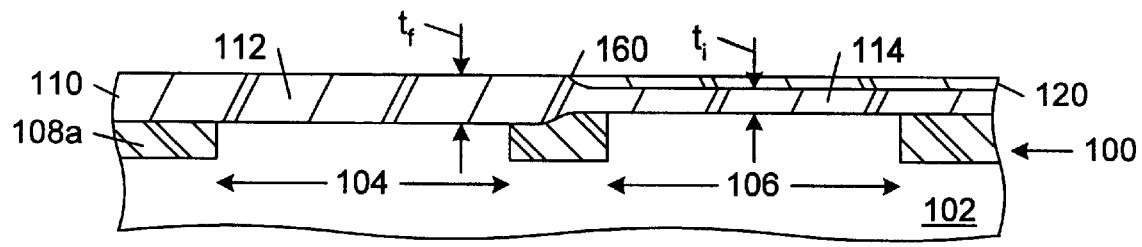
FIG. 5 is a processing step subsequent to the chemical mechanical polishing of FIG. 4 showing a reduced thickness first portion of the gate dielectric layer.
Figure 6:
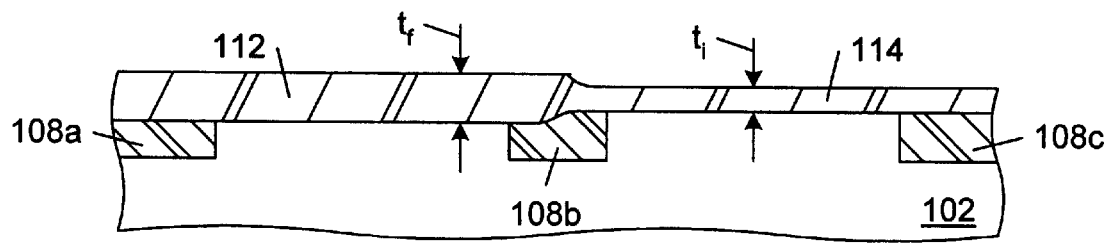
FIG. 6 is a processing step subsequent to FIG. 5 in which remaining portions of the oxidation inhibiting mask have been removed.

FIG. 5 shows a partial cross-sectional view of semiconductor wafer 100 after the chemical mechanical polishing process shown and described with respect to FIG. 4. The chemical mechanical polish typically produces a substantially planar upper surface 160 of semiconductor wafer 100. In a presently preferred embodiment of the dual gate integrated circuit, the chemical mechanical polish process reduces a thickness of first portion 112 to a final thickness $t_f$. The final thickness $t_f$ of first portion 112 of initial dielectric layer 110 is less than the first thickness $t_f$, and is greater than the initial thickness $t_i$ of second portion 114 of dielectric layer 110. This intermediate thickness of first portion 112 of dielectric layer 110 is accomplished by continuing the chemical mechanical polish process until some but not all of oxidation inhibiting mask 120 has been polished away. FIG. 5 shows a residual portion of oxidation inhibiting mask 120 still remaining over first portion 114 of dielectric layer 110 after completion of the chemical mechanical polish of FIG. 4. Typically, the residual portion of oxidation inhibiting mask 120 is removed with a wet or dry process. In an embodiment in which oxidation inhibiting mask 120 comprises silicon nitride, for example, a suitable wet process for removing the silicon nitride comprises immersing semiconductor wafer 100 into a 85% phosphoric acid solution heated to approximately 120° C.

It is noted that the processing sequence of FIGS. 2 through 5 designed to produce dual gate dielectric thicknesses on an upper surface of the semiconductor substrate may be optionally omitted in a process application in which a single gate dielectric thickness is acceptable. In a single gate dielectric thickness application, the present invention contemplates the formation of initial gate dielectric film as shown in FIG. 1 and performing a chemical mechanical polish process analogous to the process shown and described with respect to FIG. 4 to produce a finished gate dielectric layer which has a thickness that is less than a thickness of the initial gate dielectric. In a presently preferred embodiment, a thickness of the finished gate dielectric layer is in the range of approximately 25 to 60 angstroms.

Figure 7:
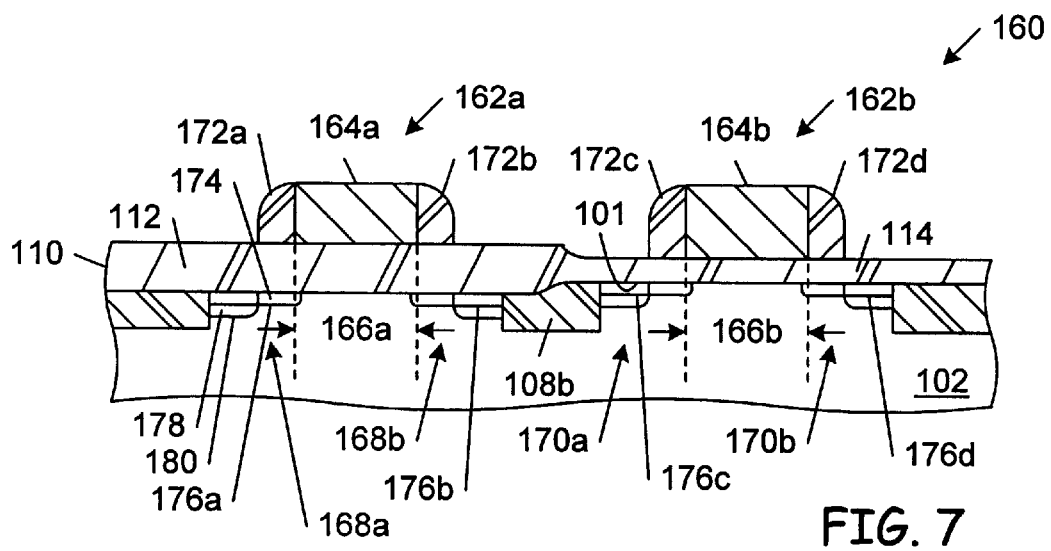
FIG. 7 is a processing step subsequent to FIG. 6 in which a first and a second transistor have been formed within the first and second regions of the semiconductor substrate respectively.

FIG. 7 shows integrated circuit 160 comprising a first transistor 162a formed over a first portion 112 of a gate dielectric film 110 and a second transistor 162b formed over a second portion 114 of gate dielectric layer 110. A thickness of first portion 112 of gate dielectric layer 110 is greater than a thickness of second portion of gate dielectric layer 110. First transistor 162a further includes a first conductive gate 164a formed on an upper surface of first portion 112 of dielectric layer 110. First conductive gate 164a is laterally aligned over a first channel region 166a of semiconductor substrate 102. First transistor 162a further includes a pair of source/drain structures 168a and 168b formed within an upper region of semiconductor substrate 102 laterally displaced on either side of first channel region 166a. First conductive gate 164 is suitably comprised of heavily doped polysilicon (i.e., polysilicon having a sheet resitivity of less than approximately 500 $\Omega$/square).

Conductive gate structures such as first conductive gate structure 164a may be fabricated by a polysilicon deposition process followed by a conventional photolithography masking step and a polysilicon etch process. A preferred method of depositing polysilicon includes thermally decomposing silane in a chemical vapor deposition reactor chamber maintained at a temperature in the range of approximately 580° C. to 650° C. Either after or during the deposition of the polysilicon, an impurity distribution is typically introduced into the polysilicon to reduce the sheet resitivity to a suitable value. The introduction of an impurity distribution into chemically vapor deposited polysilicon may be accomplished either in situ or post deposition with an ion implantation. Boron, arsenic, or phosphorous are typically used as the impurity species depending upon the desired conductivity type of the conductive gate structure.

First transistor 162a further includes a pair of spacer structures 172a and 172b formed on respective sidewalls of conductive gate structure 164a. Spacer structures such as spacer structure 172a and 172b are typically incorporated onto the sidewalls of a conductive gate structures in conjunction with the formation of lightly doped source/drain structures. Fabrication of spacer structures 172 is suitably accomplished using a low pressure (less than approximately 2 torrs) CVD process. In one embodiment, spacer structures 172 include an oxide fabricated by immersing semiconductor wafer 100 into a CVD reactor chamber maintained at a temperature of approximately 300° C. to 600° C. and introducing an oxygen source such as TEOS into the reactor chamber. Low pressure chemical vapor deposition processes such as the one described typically result in the formation of a conformal thin film. For purposes of this disclosure, a conformal film refers to a film wherein the film thickness varies less than approximately 20% across the underlying topography. After the deposition of the conformal film, an anisotropic dry etch process is performed to substantially remove the portions of the conformal film in planar regions of the underlying topography. Planar regions refer to regions substantially parallel to upper surface 101 of semiconductor substrate 102.

Prior to the formation of spacer structures 172, a lightly doped impurity distribution 174 is introduced into lightly doped regions 176 of semiconductor substrate 102. Lightly doped source/drain region 176 extend laterally on either side of channel region 166a. After the formation of spacer structures 172, a heavily doped impurity distribution 178 is typically introduced into heavily doped source/drain regions 180 of semiconductor substrate 102. The introduction of heavily doped impurity distribution 178 in the presence of spacer structure 172 ensures that heavily doped source/drain regions 180 are laterally displaced from respective boundaries of channel region 166a by a lateral displacement approximately equal to a lateral displacement of spacer structures 172. Lightly doped source/drain structures such as source/drain structures 168a and 168b beneficially minimize the maximum electric field that occurs in the vicinity of the channel region 166a thereby advantageously minimizing the occurrence of hot electron injection.

Both lightly doped impurity distribution 174 and heavily doped impurity distribution 178 are typically introduced into semiconductor substrate 102 through the use of an ion implantation process. Preferably, an energy used for lightly doped impurity distribution 174 is less than an implant energy used to implant heavily doped impurity distribution 178. A suitable implant dose 174 is in the range of approximately $5 \times 10^{13}$ to $5 \times 10^{14}$ atoms/cm$^2$ whereas a suitable implant dose used for heavily doped impurity distribution 178 is preferably in the range of approximately $5 \times 10^{14}$ to $5 \times 10^{15}$ atoms/cm$^2$. For p-channel transistors, a boron impurity species is typically used whereas, for an n-channel transistor, arsenic or phosphorous are preferred. Second transistor 162b includes features analogous to the features described with respect to first transistor 162a as will be appreciated to those skilled in the art of semiconductor processing and transistor fabrication. Isolation structure 108b serves to electrically isolate first transistor 162a from second transistor 162b. In the presently preferred embodiment, a thickness of first and second portions 112 and 114 of gate dielectric layer 110 is in the range of approximately 25 to 60 angstroms.

It will be appreciated to those skilled in the art that the present invention contemplates the formation of an ultra-thin gate dielectric through the use of a chemical mechanical polish process. Various modifications and changes may be made to each and every processing step as would be obvious to a person skilled in the art having the benefit of this disclosure. It is intended that the following claims be interpreted to embrace all such modifications and changes and, accordingly, the specification and drawings are to be regarded in an illustrative rather than a restrictive sense.

What is claimed is:

1. A semiconductor process, comprising providing a semiconductor substrate forming an initial gate dielectric layer on an upper surface of said semiconductor substrate;

polishing said initial gate dielectric layer with a chemical mechanical polish to produce a finished gate dielectric layer, wherein a thickness of said finished gate dielectric layer is less than a thickness of said initial gate dielectric layer and wherein said thickness of said finished gate dielectric layer is in the range of approximately 25 to 60 angstroms.

2. The process of claim 1, wherein the step of providing said semiconductor substrate comprises providing a monocrystalline silicon substrate, wherein said silicon substrate comprises a p-type epitaxial layer formed on a p+ silicon bulk, wherein a resistivity of said p-type epitaxial layer is in the range of approximately 10 to 15 Ω-cm and wherein a peak impurity concentration of said p+ silicon bulk is greater than approximately $10^{19}$ atoms/cm$^3$.

3. The process of claim 1, wherein the step of forming said initial gate dielectric layer comprises thermally oxidizing said semiconductor substrate in an oxygen bearing ambient maintained at a temperature in the range of approximately 700 to 900° C.

4. The process of claim 1, wherein the step of forming said initial gate dielectric layer comprises depositing an oxide.

5. The process of claim 4, wherein said depositing comprises chemical vapor depositing said oxide using a TEOS source in a CVD reactor chamber maintained at a temperature in the range of approximately 300 to 600° C. and a pressure of less than approximately 2 torrs.

6. The process of claim 1, wherein said polishing comprises:

depositing a slurry on a ceramic polishing plate; and applying said initial gate dielectric layer to said polishing plate in the presence of said slurry while rotating said ceramic plate with respect to said semiconductor substrate.

7. The process of claim 6, wherein said slurry comprises fumed silica suspended in a suspending solution.

8. The process of claim 7, wherein said suspending solution comprises a material selected from the group consisting of KOH and NH$_3$OH.

9. The process of claim 6, wherein said polishing plate comprises aluminum oxide.

10. A process for fabricating a dual gate dielectric thickness integrated circuit, comprising:

providing a semiconductor substrate;

forming an initial gate dielectric layer on an upper surface of said semiconductor substrate, said initial gate dielectric layer having an initial thickness;

increasing a thickness of a first portion of said initial gate dielectric layer to a first thickness, wherein said first portion of said initial gate dielectric layer is aligned over a first region of said semiconductor substrate;

polishing said initial gate dielectric layer with a chemical mechanical polish to reduce said first thickness of said first portion to a final thickness, wherein said final thickness is less than said first thickness and greater than said initial thickness, wherein said initial gate dielectric layer comprises a first portion of said final thickness and a second portion of said initial thickness, said second portion aligned over a second region of said semiconductor substrate;

forming first and second conductive gate structures over said first and second portions respectively of said initial gate dielectric layer, wherein said conductive gate structures are aligned over respective channel regions within said first and second regions of said semiconductor substrate; and forming first and second pairs of source/drain structures within first and second pairs of source/drain regions of said semiconductor substrate, wherein said pairs of source/drain regions are laterally displaced on either side of respective said channel regions of said semiconductor substrate.

11. The process of claim 10, wherein said semiconductor substrate, comprises a p-type epitaxial layer formed on a upper surface of an p+ silicon bulk, wherein a resistivity of said p-type epitaxial layer is in the range of approximately 10 to 15 Ω-cm.

12. The process of claim 10, wherein said semiconductor substrate comprises silicon and further wherein the step of forming said initial gate dielectric layer comprises immersing said semiconductor substrate in an oxygen bearing ambient maintained at a temperature in the range of approximately 700 to 900° C. to thermally oxidize an upper surface of said semiconductor substrate.

13. The process of claim 10, wherein the step of increasing said thickness comprises selectively oxidizing a portion of said initial gate dielectric layer.

14. The process of claim 13, wherein the step of selectively oxidizing said portion comprises:

forming an oxidation inhibiting mask over said second portion of said initial gate dielectric layer; and immersing said semiconductor substrate in an oxygen bearing ambient maintained at a temperature in the range of approximately 700 to 900° C.

15. The process of claim 14, wherein said oxidation inhibiting mask comprises silicon nitride.

16. The process of claim 10, wherein said polishing comprises:

depositing a slurry on a ceramic polishing plate; and applying said initial gate dielectric layer to said polishing plate in the presence of said slurry while rotating said polishing plate with respect to said semiconductor substrate.

17. The process of claim 16, wherein said slurry comprises fumed silica suspended in a suspending solution.

18. The process of claim 17, wherein said suspending solution is selected from the group consisting of KOH and $NH_3OH$.

19. The process of claim 16, wherein said polishing plate comprises aluminum oxide.

* * * * *

UNITED STATES PATENT AND TRADEMARK OFFICE
CERTIFICATE OF CORRECTION

PATENT NO.   : 5,985,706
DATED        : November 16, 1999
INVENTOR(S)  : Gilmer, et. al.

It is certified that error appears in the above-identified patent and that said Letters Patent is hereby corrected as shown below:

Title page, item [54] and col. 1, line 1, delete "GATES" and insert -- GATE--.

Signed and Sealed this

Twenty-seventh Day of June, 2000

*Attest:*

Q. TODD DICKINSON

*Attesting Officer*   *Director of Patents and Trademarks*